(12) United States Patent
Okita et al.

(10) Patent No.: US 8,624,305 B2
(45) Date of Patent: Jan. 7, 2014

(54) SOLID-STATE IMAGING DEVICE AND METHOD FOR MANUFACTURING SOLID-STATE IMAGING DEVICE, AND ELECTRONIC DEVICE

(75) Inventors: Hiroyuki Okita, Tokyo (JP); Toshitaka Kawashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 272 days.

(21) Appl. No.: 12/938,790

(22) Filed: Nov. 3, 2010

(65) Prior Publication Data
US 2011/0115003 A1    May 19, 2011

(30) Foreign Application Priority Data

Nov. 17, 2009  (JP) ................................. 2009-261994
Sep. 9, 2010   (JP) ................................. 2010-202141

(51) Int. Cl.
*H01L 31/00*     (2006.01)

(52) U.S. Cl.
USPC  257/291; 257/40; 257/E27.111; 257/E27.135; 257/E27.14; 438/149

(58) Field of Classification Search
USPC ............... 257/40, E27.135, E27.14, E51.001, 257/291, E27.111; 438/149
See application file for complete search history.

(56) References Cited

U.S. PATENT DOCUMENTS

| | | | |
|---|---|---|---|
| 6,909,099 B2* | 6/2005 | Choo et al. ............... | 250/370.09 |
| 7,683,365 B2* | 3/2010 | Nii .................. | 257/40 |
| 8,059,220 B2* | 11/2011 | Oyamada ........................ | 349/39 |
| 2006/0215068 A1* | 9/2006 | Nakagawa ....................... | 349/38 |
| 2009/0280600 A1* | 11/2009 | Hosono et al. ................ | 438/104 |

FOREIGN PATENT DOCUMENTS

| | | |
|---|---|---|
| JP | 2003-234460 | 8/2003 |
| JP | 2004-335626 | 11/2004 |
| JP | 2005-347356 | 12/2005 |
| JP | 2005-353626 | 12/2005 |

* cited by examiner

*Primary Examiner* — John C Ingham
(74) *Attorney, Agent, or Firm* — Dentons US LLP

(57) ABSTRACT

A solid-state imaging device includes a photoelectric conversion portion that is provided above an imaging surface of a substrate, and a plurality of readout circuit portions that are provided below the photoelectric conversion portion on the imaging surface. The photoelectric conversion portion includes a photoelectric conversion film that receives incident light and produces a signal charge, and a first electrode and a second electrode that sandwich the photoelectric conversion film, and the first electrode, the photoelectric conversion film, and the second electrode are sequentially layered upward on the imaging surface. Further, each of the readout circuit portions includes a readout circuit that is electrically connected with the first electrode and reads out the signal charge produced by the photoelectric conversion portion, and a ground electrode that is grounded, and the ground electrode is interposed between the readout circuit and the first electrode on the imaging surface.

7 Claims, 9 Drawing Sheets

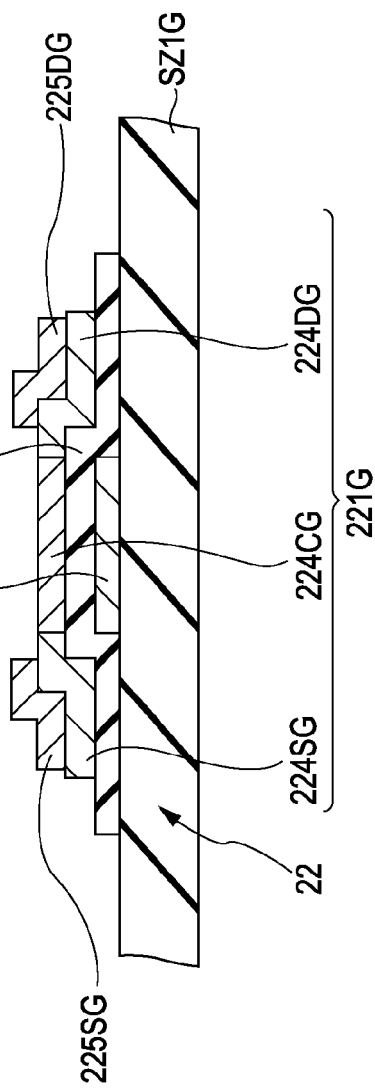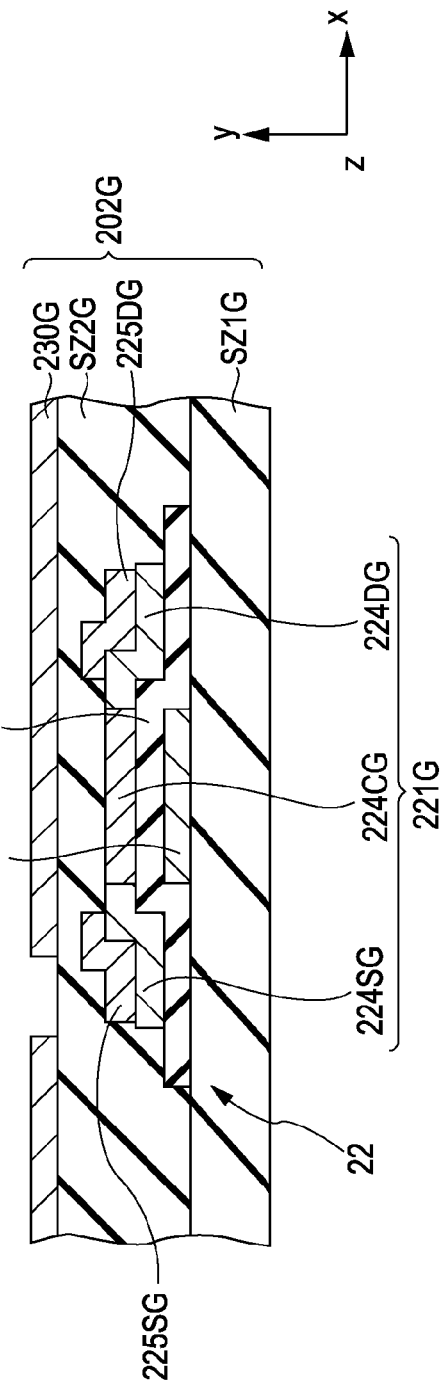

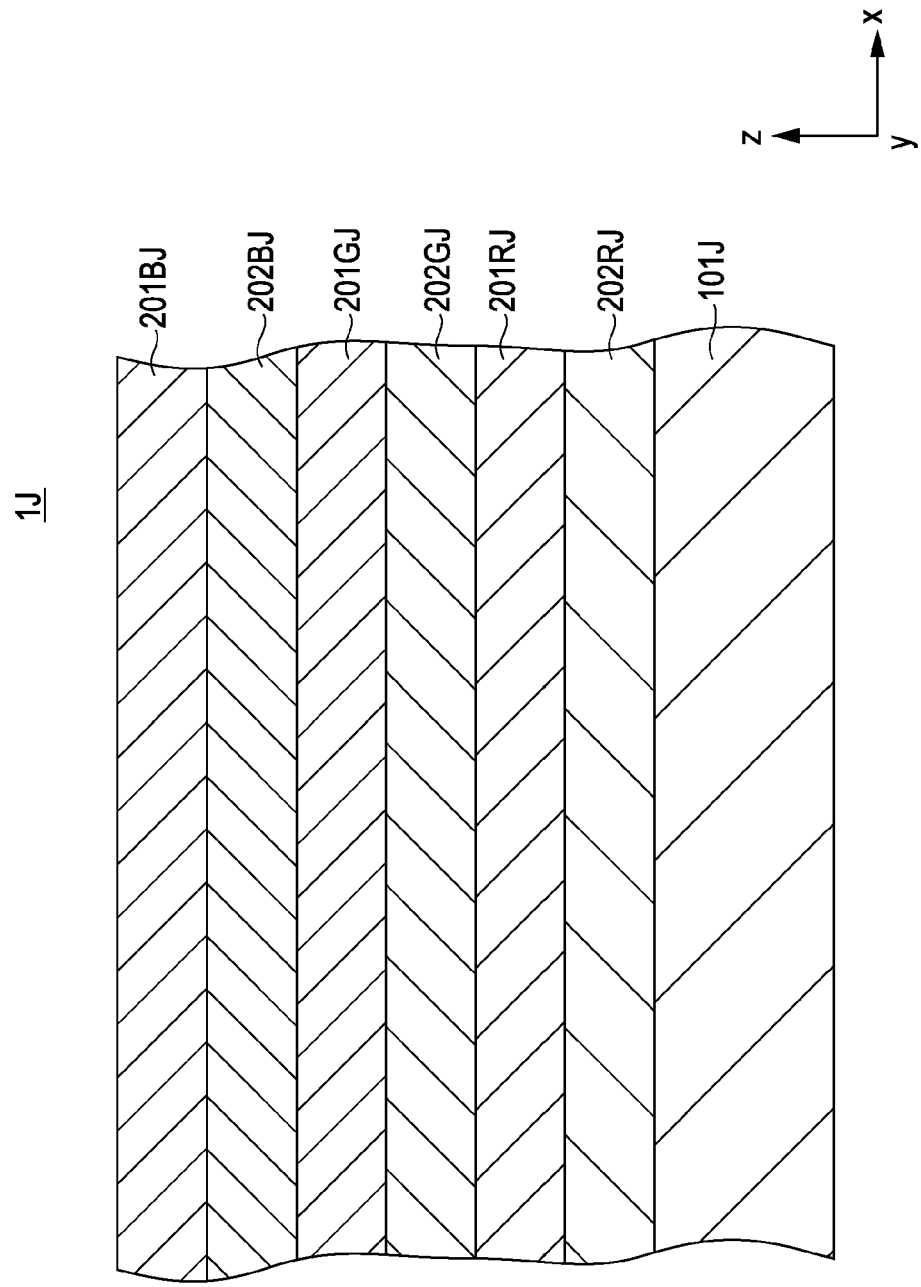

SOLID-STATE IMAGING DEVICE AND METHOD FOR MANUFACTURING SOLID-STATE IMAGING DEVICE, AND ELECTRONIC DEVICE

BACKGROUND OF THE INVENTION

1. Field of the Invention

The present invention relates to a solid-state imaging device, a method for manufacturing a solid-state imaging device, and an electronic device.

2. Description of the Related Art

Electronic devices such as a digital video camera and a digital still camera include a solid-state imaging device. Such electronic devices include a complementary metal oxide semiconductor (CMOS) type image sensor or a charge coupled device (CCD) type image sensor, for example, as the solid-state imaging device.

In a solid-state imaging device, a plurality of pixels are arranged in matrix on an imaging surface of a semiconductor substrate. Each of the plurality of pixels is provided with a photoelectric conversion portion. A photodiode, for example, is provided as the photoelectric conversion portion.

Among solid-state imaging devices, a CMOS type image sensor has a pixel which is provided with a semiconductor element such as a pixel transistor as well as the photoelectric conversion portion. As the pixel transistor, a plurality of transistors are provided to read out a signal charge produced by the photoelectric conversion portion and output the signal charge as an electric signal to a signal line.

In a solid-state imaging device, the photoelectric conversion portion receives light which is incident through an optical component such as a color filter, at a light receiving surface and photoelectrically converts the light so as to produce a signal charge.

For example, when color filters of three primary colors of red, green, and blue are arranged along an imaging surface in a manner to correspond to each pixel, the photoelectric conversion portion receives colored light which is colored by each of the color filters of the respective colors, in each pixel. That is, focusing on a pixel above which a red color filter is provided, the red color filter absorbs light of green and blue components in light which is incident as an object image and transmits only light of a red component therethrough, and the photoelectric conversion portion receives the transmitted light of the red component below the red color filter.

The solid-state imaging device is demanded to be small-sized, and at the same time, to have increased number of pixels. Accordingly, a size of one pixel is made smaller, so that the pixel has more difficulty in receiving sufficient amount of light. Thus, it is not easy to improve image quality of a picked-up image.

In order to eliminate such defect, a "stacked photoelectric conversion layer type" is proposed. In the "stacked photoelectric conversion layer type", photoelectric conversion portions of respective colors are not arranged in a direction along an imaging surface, but the photoelectric conversion portions which selectively receive light of respective colors are layered in a vertical direction with respect to the imaging surface. For example, three layers of photoelectric conversion films made of an organic material are stacked so as to sequentially receive light of each of the three primary colors included in incident light (refer to Japanese Unexamined Patent Application Publication No. 2004-335626, Japanese Unexamined Patent Application Publication No. 2005-347356, Japanese Unexamined Patent Application Publication No. 2005-353626, Japanese Unexamined Patent Application Publication No. 2003-234460, and "CMOS Image Sensor with Stacked Organic Photoelectric Conversion Layers" by M. IHAMA et al., FUJIFILM RESEARCH & DEVELOPMENT (No. 52-2007), p. 3-6, for example).

In the "stacked photoelectric conversion layer type", part of incident light is absorbed at a photoelectric conversion film which is provided at an upper side and is photoelectrically converted. Then, other part of the light which is not absorbed at the photoelectric conversion film provided at the upper side is absorbed by another photoelectric conversion film positioned below the above-mentioned film and is photoelectrically converted. For example, an uppermost photoelectric conversion film absorbs blue color light, an intermediate photoelectric conversion film absorbs green color light, and a lowermost photoelectric conversion film absorbs red color light. Then, photoelectric conversion is performed in each of the photoelectric conversion films so as to produce a signal charge.

Thus, in the "stacked photoelectric conversion layer type", not merely colored light of a single color but colored light of a plurality of colors is received at each pixel position. Accordingly, light utilization efficiency can be improved, whereby small-sizing can be easily realized. Specifically, a solid-state imaging device of the "stacked photoelectric conversion layer type" has light utilization efficiency of three times as much as a case where color filters of the three primary colors of red, green, and blue are arranged along an imaging surface, so that an area per pixel can be reduced to be one-third.

In a CMOS type image sensor of the "stacked photoelectric conversion layer type", semiconductor elements such as a transistor are formed in an integrated manner on a surface of a substrate so as to read out a signal charge produced in photoelectric conversion films which receive respective colored light.

Thus, transistors for a plurality of colors (for example, three primary colors) are formed to be arranged on the surface of the substrate, increasing an area occupied by these transistors. Accordingly, it may be difficult to realize small-sizing.

In order to eliminate such defect, it is proposed to provide a readout circuit for reading out an electric charge immediately beneath a photoelectric conversion film of each color without providing transistors for a plurality of colors in an integrated manner on a surface of a substrate (refer to "The latest trend in CMOS image sensors" by J. OHTA et al., CMC Publishing Co., Ltd, April 2007, p. 119, for example).

SUMMARY OF THE INVENTION

FIGS. 8 and 9 schematically illustrate a CMOS type image sensor of the "stacked photoelectric conversion layer type". FIG. 8 shows a section and FIG. 9 shows an enlarged part of FIG. 8.

As shown in FIG. 8, a CMOS type image sensor 1J of the "stacked photoelectric conversion layer type" includes a red photoelectric conversion portion 201RJ, a green photoelectric conversion portion 201GJ, and a blue photoelectric conversion portion 201BJ. The CMOS type image sensor 1J further includes a red readout circuit portion 202RJ, a green readout circuit portion 202GJ, and a blue readout circuit portion 202BJ.

Respective elements constituting the CMOS type image sensor 1J of the "stacked photoelectric conversion layer type" are provided on a substrate 101J as shown in FIG. 8.

Specifically, the red readout circuit portion 202RJ and the red photoelectric conversion portion 201RJ are sequentially provided on an upper surface of the substrate 101J which is made of semiconductor, as shown in FIG. 8. Then, on an upper surface of the red photoelectric conversion portion 201RJ, the green readout circuit portion 202GJ and the green photoelectric conversion portion 201GJ are sequentially provided. Further, on an upper surface of the green photoelectric conversion portion 201GJ, the blue readout circuit portion 202BJ and the blue photoelectric conversion portion 201BJ are sequentially provided.

As shown in FIG. 9, the green photoelectric conversion portion 201GJ includes an organic photoelectric conversion layer for sensing green light 210GJ, a pixel electrode 211GJ, and a common electrode 212GJ.

The organic photoelectric conversion layer for sensing green light 210GJ absorbs and photoelectrically converts light of a green component included in incident light so as to produce a signal charge. Here, the organic photoelectric conversion layer for sensing green light 210GJ is sandwiched by the pixel electrode 211GJ and the common electrode 212GJ on an upper surface of the green readout circuit portion 202GJ, as shown in FIG. 9.

The pixel electrode 211GJ and the common electrode 212GJ are transparent electrodes which transmit light therethrough. The pixel electrode 211GJ is disposed in plural number with a gap (not shown) interposed so as to correspond to a plurality of pixels P. Further, the common electrode 212GJ is integrally formed to be opposed to the plurality of pixel electrodes 211GJ with the organic photoelectric conversion layer for sensing green light 210GJ interposed.

As shown in FIG. 9, the green readout circuit portion 202GJ includes a TFT 220GJ which is provided on an insulation film SZ1G. The TFT 220GJ includes a semiconductor layer 221GJ, a gate insulation film 222GJ, and a gate electrode 223GJ, and is formed to have a bottom-gate type structure, for example. In the TFT 220GJ, the semiconductor layer 221GJ includes a channel region 224CG, a source 224SG, and a drain 224DG, and the source 224SG and the drain 224DG sandwich the channel region 224CG. In the semiconductor layer 221GJ, the source 224SG is connected with a source electrode 225SG and the drain 224DG is connected with a drain electrode 225DG. The TFT 220GJ is covered by an interlayer insulation film SZ2G, and the source electrode 225SG is electrically connected to the pixel electrode 211GJ through a contact CT.

In the CMOS type image sensor 1J of the "stacked photoelectric conversion layer type" described above, when incident light is incident on each of the pixels P, a signal charge is sequentially produced in each of the photoelectric conversion portions 201RJ, 201GJ, and 201BJ.

Specifically, in the blue photoelectric conversion portion 201BJ, a signal charge which corresponds to an amount of light of a blue component included in the incident light is produced. In the green photoelectric conversion portion 201GJ, a signal charge which corresponds to an amount of light of a green component included in the incident light is produced. In the red photoelectric conversion portion 201RJ, a signal charge which corresponds to an amount of light of a red component included in the incident light is produced.

In each of the photoelectric conversion portions 201RJ, 201GJ, and 201BJ, a voltage is applied between the pixel electrode (211GJ, for example) and the common electrode (212GJ, for example) and a signal charge is read out from each of the photoelectric conversion films (210GJ, for example) to each of the readout circuit portions (202GJ, for example).

As described above, in each of the photoelectric conversion portions (201GJ, for example), a voltage is applied to each of the photoelectric conversion films (210GJ, for example) between the pixel electrode (211GJ, for example) and the common electrode (212GJ, for example). That is, each of the photoelectric conversion films (210GJ, for example) turns to be in such a state that a reverse bias voltage is applied to a so-called pn-junction photodiode. Therefore, the voltage applied to the photoelectric conversion film (210GJ, for example) may adversely affect the TFT (220GJ, for example). Namely, a voltage applied to each of the organic photoelectric conversion layers (210GJ, for example) may produce a state same as the state that a voltage is applied to a gate of the TFT (220GJ, for example), causing a defect such as deterioration of image quality of a picked-up image.

In order to eliminate the above defect, it can be considered to distance the organic photoelectric conversion layer for sensing green light 210GJ away from the TFT 220GJ by thickening a film thickness of the interlayer insulation film SZ2G. However, the whole thickness is increased in this case.

Therefore, light incident from an upper layer side may not be received by an organic photoelectric conversion layer of the desired pixel but may be received by an organic photoelectric conversion layer of an adjacent pixel.

For example, in the case of FIG. 8, light of a blue component included in incident light incident on a pixel is precisely received by the blue photoelectric conversion portion 201BJ which is the uppermost layer. However, since the green photoelectric conversion portion 201GJ and the red photoelectric conversion portion 201RJ are disposed at a lower layer side, light of a green component or a red component may not be received by a pixel on which the light is incident but may be received by an adjacent pixel. Since the red photoelectric conversion portion 201RJ is provided at the lowermost layer in the above case, this phenomenon notably occurs in a case of the light of the red component. With this phenomenon, a defect such as deterioration of image quality of a picked-up image may occur.

It is desirable to provide a solid-state imaging device, a method for manufacturing a solid-state imaging device, and an electronic device which can improve image quality of a picked-up image.

A solid-state imaging device according to an embodiment of the present invention includes a photoelectric conversion portion that is provided above an imaging surface of a substrate, and a plurality of readout circuit portions that are provided below the photoelectric conversion portion on the imaging surface. In the solid-state imaging device, the photoelectric conversion portion includes a photoelectric conversion film that receives incident light and produces a signal charge, and a first electrode and a second electrode that sandwich the photoelectric conversion film, and the first electrode, the photoelectric conversion film, and the second electrode are sequentially layered upward on the imaging surface. Further, in the solid-state imaging device, each of the readout circuit portions includes a readout circuit that is electrically connected with the first electrode and reads out the signal charge produced by the photoelectric conversion portion, and a ground electrode that is grounded, and the ground electrode is interposed between the readout circuit and the first electrode on the imaging surface.

A method for manufacturing a solid-state imaging device according to an embodiment of the present invention includes the step of manufacturing a solid-state imaging device in which a photoelectric conversion portion is provided above an imaging surface of a substrate and a readout circuit portion is provided below the photoelectric conversion portion. In the method, the step of manufacturing a solid-state imaging device includes the steps of forming the photoelectric conversion portion and forming the readout circuit portion. In the step of forming the photoelectric conversion portion, a first electrode, a photoelectric conversion film that receives incident light and produces a signal charge, and a second electrode are sequentially formed to be layered in such a manner that the first electrode and the second electrode sandwich the photoelectric conversion film, above the imaging surface. In the step of forming the readout circuit portion, the readout circuit portion and a ground electrode that is grounded are formed in a manner that the ground electrode is interposed between a readout circuit that is electrically connected with the first electrode and reads out the signal charge produced by the photoelectric conversion portion and the first electrode.

An electronic device according to an embodiment of the present invention includes a solid-state imaging device that includes a photoelectric conversion portion provided above an imaging surface of a substrate and a readout circuit portion provided below the photoelectric conversion portion on the imaging surface. In the electronic device, the photoelectric conversion portion includes a photoelectric conversion film that receives incident light and produces a signal charge, and a first electrode and a second electrode that sandwich the photoelectric conversion film, and the first electrode, the photoelectric conversion film, and the second electrode are sequentially layered upward on the imaging surface. Further, in the electronic device, the readout circuit portion includes a readout circuit that is electrically connected with the first electrode and reads out the signal charge produced by the photoelectric conversion portion, and a ground electrode that is grounded, and the ground electrode is interposed between the readout circuit and the first electrode on the imaging surface.

In the embodiment of the present invention, the ground electrode can prevent an occurrence of such a state that unnecessary voltage other than a gate voltage is applied to a channel forming region of a TFT which constitutes each of the readout circuit portions.

According to the embodiment of the present invention, a solid-state imaging device, a method for manufacturing a solid-state imaging device, and an electronic device which can improve manufacturing efficiency and image quality of a picked-up image can be provided.

BRIEF DESCRIPTION OF THE DRAWINGS

FIGS. 6A and 6B illustrate a method for manufacturing the green photoelectric conversion portion 2G and the green readout circuit portion 2G according to the embodiment of the present invention;

FIG. 8 schematically illustrates a CMOS type image sensor of a "stacked photoelectric conversion layer type"

DESCRIPTION OF THE PREFERRED EMBODIMENTS

An embodiment of the present invention will be described below with reference to the accompanying drawings.

The description is offered as the following order.
1. Embodiment
2. Modification
<1. Embodiment>
(A) Device Configuration
(A-1) Configuration of Chief Part of Camera FIG. 1 is a configuration diagram showing the configuration of a camera 40 according to an embodiment of the present invention.

Figure 1:
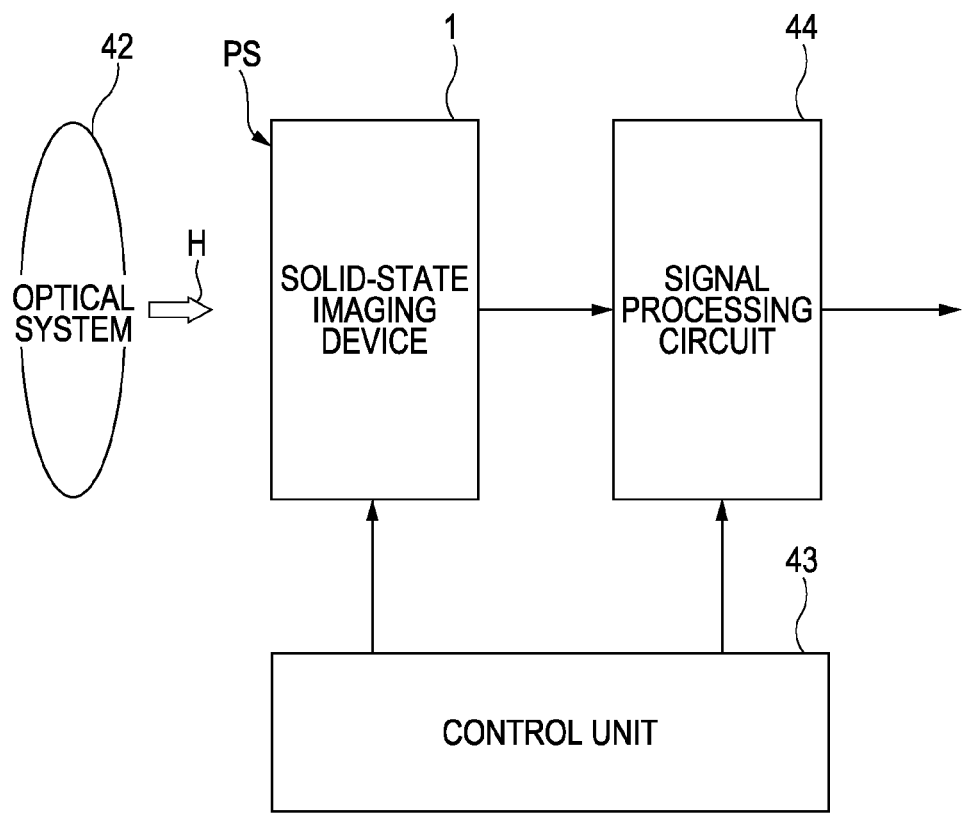
FIG. 1 is a configuration diagram showing the configuration of a camera according to an embodiment of the present invention.

As shown in FIG. 1, the camera 40 includes a solid-state imaging device 1, an optical system 42, a control unit 43, and a signal processing circuit 44. Each of the elements is described in sequence.

The solid-state imaging device 1 receives and photoelectrically converts light (object image) H which is incident through the optical system 42, at an imaging surface PS so as to produce a signal charge. Here, the solid-state imaging device 1 is driven based on a control signal outputted from the control unit 43. Specifically, the solid-state imaging device 1 reads a signal charge and outputs it as raw data.

The optical system 42 includes optical members such as an image-forming lens and a diaphragm, and is disposed so as to focus the light H incident as the object image on the imaging surface PS of the solid-state imaging device 1.

The control unit 43 outputs various types of control signals to the solid-state imaging device 1 and the signal processing circuit 44 so as to control and drive the solid-state imaging device 1 and the signal processing circuit 44.

The signal processing circuit 44 executes signal processing on the raw data outputted from the solid-state imaging device 1 so as to produce a digital image of the object image.
(A-2) Configuration of Chief Part of Solid-State Imaging Device The whole configuration of the solid-state imaging device 1 is described.

Figure 2:
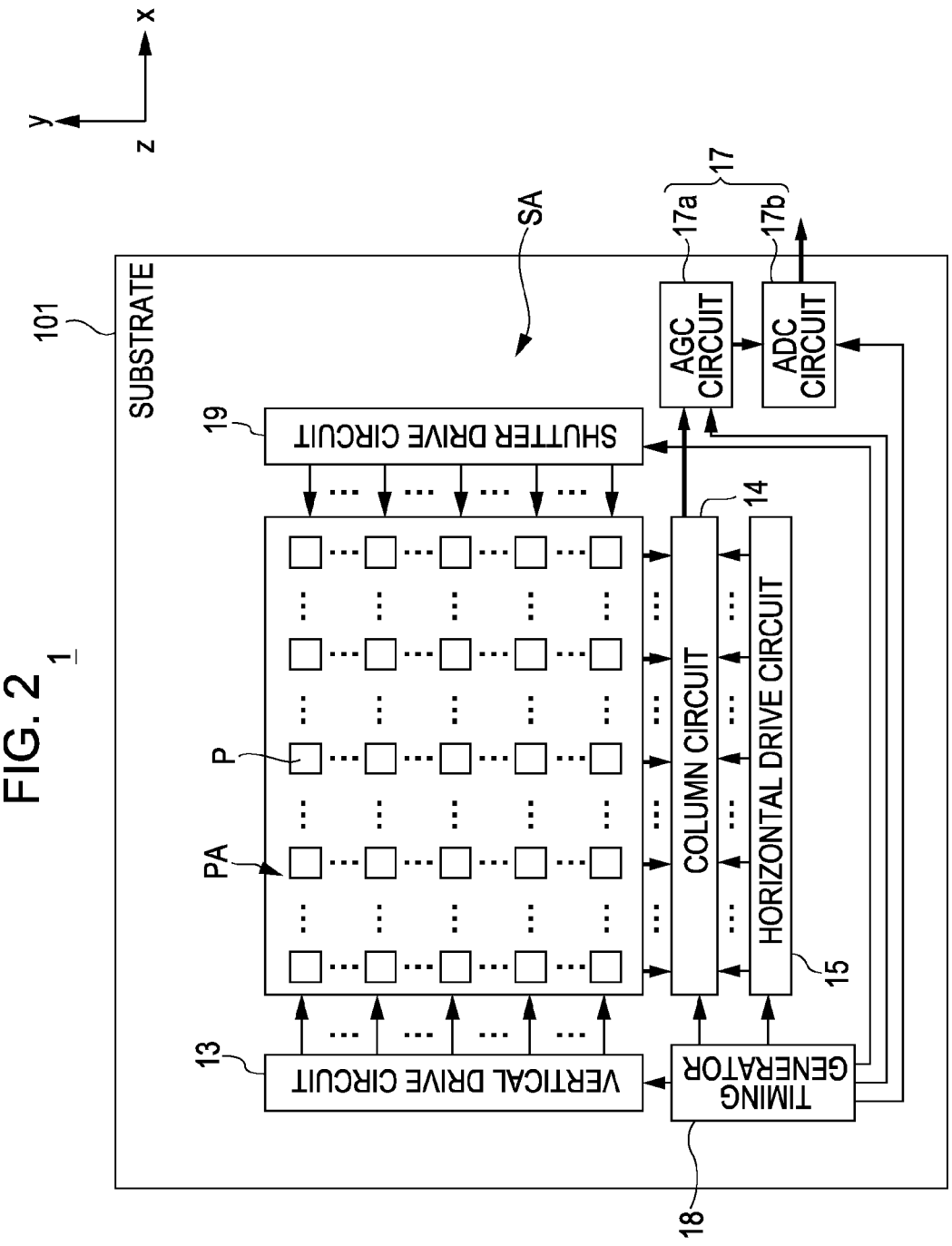
FIG. 2 is a block diagram showing the whole configuration of a solid-state imaging device according to the embodiment of the present invention.

FIG. 2 is a block diagram showing the whole configuration of the solid-state imaging device 1 according to the embodiment of the present invention.

The solid-state imaging device 1 of the embodiment is a CMOS type image sensor, and includes a substrate 101 as shown in FIG. 2. The substrate 101 is a semiconductor substrate made of silicon, for example, and includes an imaging region PA and a peripheral region SA provided on a surface thereof, as shown in FIG. 2.

The imaging region PA has a rectangular shape and includes a plurality of pixels P which are arranged in a horizontal direction x and a vertical direction y, as shown in FIG. 2. That is, the pixels P are arranged in matrix. Further, the imaging region PA corresponds to the imaging surface PS shown in FIG. 1. Details of the pixels P will be described later.

The peripheral region SA is positioned at the periphery of the imaging region PA as shown in FIG. 2. In the peripheral region SA, peripheral circuits are provided.

Specifically, a vertical drive circuit 13, a column circuit 14, a horizontal drive circuit 15, an external output circuit 17, a timing generator 18, and a shutter drive circuit 19 are provided as the peripheral circuits, as shown in FIG. 2.

The vertical drive circuit 13 is provided at a lateral part of the imaging region PA in the peripheral region SA as shown in FIG. 2 and is configured to select and drive pixels P of the imaging region PA row by row.

The column circuit 14 is provided at a lower end part of the imaging region PA in the peripheral region SA as shown in FIG. 2, and executes signal processing on signals outputted from the pixels P column by column. Here, the column circuit 14 includes a correlated double sampling (CDS) circuit (not shown) and executes signal processing for removing fixed pattern noise.

The horizontal drive circuit 15 is electrically connected with the column circuit 14 as shown in FIG. 2. The horizontal drive circuit 15 includes a shift register, for example, and allows the column circuit 14 to sequentially output signals, which are held for each column of the pixels P, to the external output circuit 17.

The external output circuit 17 is electrically connected with the column circuit 14 as shown in FIG. 2. The external output circuit 17 executes signal processing on the signals outputted from the column circuit 14 and then outputs the signals to the outside. The external output circuit 17 includes an automatic gain control (AGC) circuit 17a and an ADC circuit 17b. In the external output circuit 17, after the AGC circuit 17a gains the signals, the ADC circuit 17b converts the signals from analog signals to digital signals to output the signals to the outside.

The timing generator 18 is electrically connected with each of the vertical drive circuit 13, the column circuit 14, the horizontal drive circuit 15, the external output circuit 17, and the shutter drive circuit 19 as shown in FIG. 2. The timing generator 18 produces various types of pulse signals and outputs the signals to the vertical drive circuit 13, the column circuit 14, the horizontal drive circuit 15, the external output circuit 17, and the shutter drive circuit 19 so as to drive-control each of the elements.

The shutter drive circuit 19 selects the pixels P row by row and adjusts exposure time in the pixels P.

The above-described elements are simultaneously driven for the plurality of pixels P which are aligned in a row unit.

Specifically, the pixels P are sequentially selected in a horizontal line (pixel row) unit in the vertical direction y in accordance with a selection signal supplied by the vertical drive circuit 13 described above. Then, each of the pixels P is driven by various types of timing signals outputted from the timing generator 18. Accordingly, an electric signal outputted from each of the pixels P is read out in every pixel row through a vertical signal line 27 by the column circuit 14. Then, the signals accumulated in the column circuit 14 are selected by the horizontal drive circuit 15 and sequentially outputted to the external output circuit 17.

(A-3) Detailed Configuration of Solid-State Imaging Device

The detailed configuration of the solid-state imaging device 1 according to the embodiment of the present invention is now described.

Figure 3:
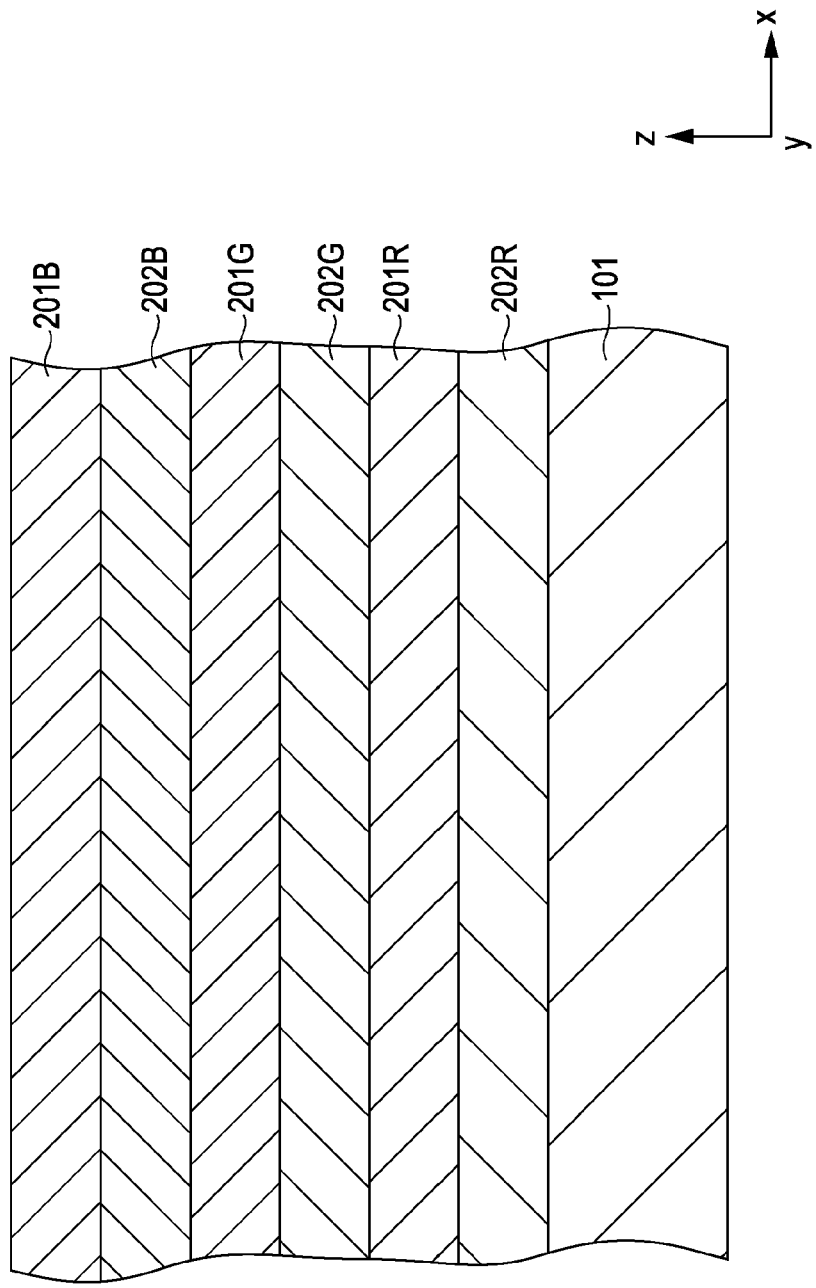
FIG. 3 illustrates a chief part of the solid-state imaging device according to the embodiment of the present invention.

FIG. 3 illustrates a chief part of the solid-state imaging device 1 according to the embodiment of the present invention. Here, FIG. 3 shows a cross-sectional surface of the imaging region PA.

The solid-state imaging device 1 is a CMOS type image sensor of the "stacked photoelectric conversion layer type", and includes a plurality of photoelectric conversion portions 201R, 201G, and 201B which are layered above an imaging surface of the substrate 101 as shown in FIG. 3. On the imaging surface of the substrate 101, readout circuit portions 202R, 202G, and 202B are provided respectively beneath the plurality of photoelectric conversion portions 201R, 201G, and 201B.

In the embodiment, the solid-state imaging device 1 includes the red photoelectric conversion portion 201R, the green photoelectric conversion portion 201G, and the blue photoelectric conversion portion 201B. Further, the solid-state imaging device 1 includes the red readout circuit portion 202R, the green readout circuit portion 202G, and the blue readout circuit portion 202B.

As shown in FIG. 3, respective elements constituting the solid-state imaging device 1 are provided on the substrate 101 which is made of silicon semiconductor, for example.

Specifically, the red readout circuit portion 202R and the red photoelectric conversion portion 201R are sequentially layered on an upper surface of the substrate 101 as shown in FIG. 3. Then, on an upper surface of the red photoelectric conversion portion 201R, the green readout circuit portion 202G and the green photoelectric conversion portion 201G are sequentially layered. Further, on an upper surface of the green photoelectric conversion portion 201G, the blue readout circuit portion 202B and the blue photoelectric conversion portion 201B are sequentially layered.

Figure 4:
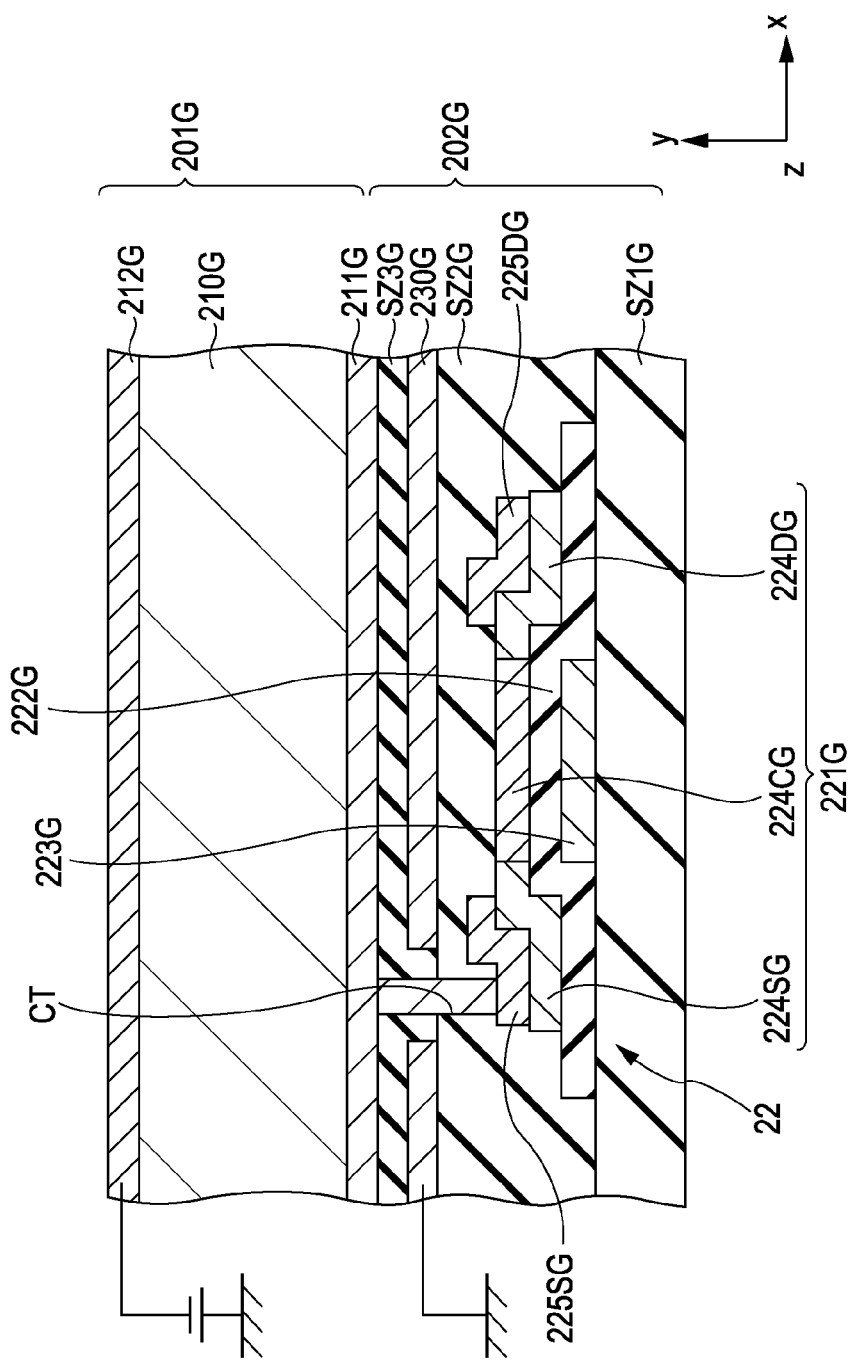
FIG. 4 illustrates parts of a green photoelectric conversion portion 2G and a green readout circuit portion 2G according to the embodiment of the present invention.
Figure 5:
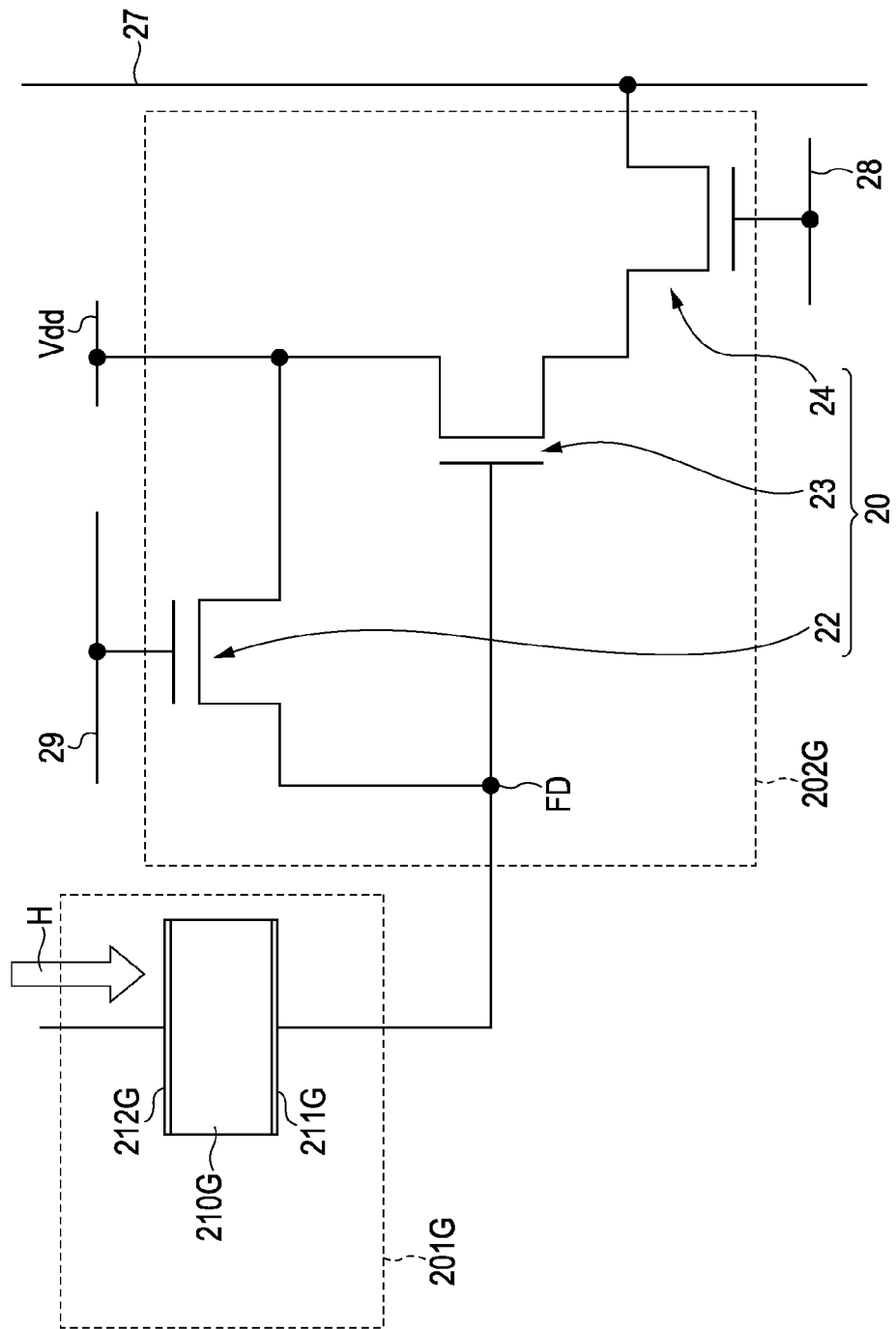
FIG. 5 illustrates parts of the green photoelectric conversion portion 2G and the green readout circuit portion 2G according to the embodiment of the present invention.

FIGS. 4 and 5 illustrate parts of the green photoelectric conversion portion 201G and the green readout circuit portion 202G according to the embodiment of the present invention.

Here, FIG. 4 is a sectional view schematically showing enlarged parts of the green photoelectric conversion portion 201G and the green readout circuit portion 202G. FIG. 5 is a pixel circuit diagram showing the circuit configuration of the green photoelectric conversion portion 201G and the green readout circuit portion 202G.

The green photoelectric conversion portion 201G includes an organic photoelectric conversion layer for sensing green light 210G, a pixel electrode 211G, and a common electrode 212G as shown in FIGS. 4 and 5. The pixel electrode 211G, the organic photoelectric conversion layer for sensing green light 210G, and the common electrode 212G are sequentially layered upward.

In the green photoelectric conversion portion 201G, the organic photoelectric conversion layer for sensing green light 210G absorbs and photoelectrically converts light of a green component which is included in incident light so as to produce a signal charge. Further, the organic photoelectric conversion layer for sensing green light 210G transmits light of a component, which is other than the green component, included in the incident light therethrough. The organic photoelectric conversion layer for sensing green light 210G is made of polycyclic organic pigment such as quinacridones, for example.

The organic photoelectric conversion layer for sensing green light 210G is provided above the green readout circuit portion 202G as shown in FIG. 4. Further, the organic photoelectric conversion layer for sensing green light 210G is sandwiched by the pixel electrode 211G and the common electrode 212G as shown in FIGS. 4 and 5.

In the green photoelectric conversion portion 201G, the pixel electrode 211G and the common electrode 212G are transparent electrodes and are configured to transmit light therethrough. For example, the pixel electrode 211G and the common electrode 212G are formed by film-depositing metal oxide such as indium tin oxide (ITO) by a film-forming method such as a sputtering method.

Here, the pixel electrode 211G is disposed in plural number with a gap (not shown) interposed so as to correspond to the plurality of pixels P.

Further, the common electrode 212G is integrally formed over the whole of the imaging region PA to be opposed to the plurality of pixel electrodes 211G with the organic photoelectric conversion layer for sensing green light 210G interposed.

Further, the pixel electrode 211G of the green photoelectric conversion portion 201G is electrically connected with the green readout circuit portion 202G as shown in FIG. 5. An electric signal depending on a signal charge produced in the organic photoelectric conversion layer for sensing green light 210G is read out by the green readout circuit portion 202G.

The green readout circuit portion 202G includes a readout circuit 20 as shown in FIG. 5.

The readout circuit 20 is provided to each of the pixels P, and reads out a signal charge produced in the organic photoelectric conversion layer for sensing green light 210G in each of the pixels P. The readout circuit 20 is disposed at a boundary of the plurality of pixels P, for example.

In the embodiment, the readout circuit 20 includes a reset transistor 22, an amplification transistor 23, and a selection transistor 24 as shown in FIG. 5, and thus the readout circuit 20 is a CMOS signal readout circuit of the three-transistor configuration.

In the green readout circuit portion 202G, the reset transistor 22 resets a gate potential of the amplification transistor 23.

Specifically, a gate of the reset transistor 22 is connected to a reset line 29 to which a row reset signal is supplied, as shown in FIG. 5. Further, a drain of the reset transistor 22 is connected to a power-source voltage supply line Vdd and a source of the reset transistor 22 is connected to a floating diffusion FD. The reset transistor 22 resets a gate potential of the amplification transistor 23 through the floating diffusion FD to a power-source potential, based on a row reset signal received from the reset line 29.

As shown in FIG. 4, the reset transistor 22 described above is provided on an insulation film SZ1G which is made of a light-transmissive insulation material such as silicon oxide which transmits incident light therethrough. The reset transistor 22 includes a semiconductor layer 221G, a gate insulation film 222G, and a gate electrode 223G, and is configured as a bottom-gate type TFT, for example. Namely, in the reset transistor 22, the semiconductor layer 221G includes a channel region 224CG, a source 224SG, and a drain 224DG, and the source 224SG and the drain 224DG sandwich the channel region 224CG. In the semiconductor layer 221G, the source 224SG is connected with a source electrode 225SG and the drain 224DG is connected with a drain electrode 225DG.

In the embodiment, the reset transistor 22 is provided as a transparent TFT which uses a transparent semiconductor thin film which transmits light therethrough. For example, the semiconductor layer 221G is made of transparent amorphous oxide semiconductor (a-InGaZnO) composed of indium, gallium, zinc, and oxygen. The gate insulation film 222G is made of silicon oxide. The gate electrode 223G is made of a transparent conductive material such as ITO. The source electrode 225SG and the drain electrode 225DG are also made of the transparent conductive material such as ITO.

As shown in FIG. 4, the reset transistor 22 is covered by an interlayer insulation film SZ2G. The source electrode 225SG of the reset transistor 22 is electrically connected to the pixel electrode 211G through a contact CT which penetrates through the interlayer insulation film SZ2G.

In the green readout circuit portion 202G, the amplification transistor 23 amplifies an electric signal depending on a signal charge produced by the organic photoelectric conversion layer for sensing green light 210G and outputs the amplified signal.

Specifically, a gate of the amplification transistor 23 is connected to the floating diffusion FD, as shown in FIG. 5. Further, a drain of the amplification transistor 23 is connected to the power-source voltage supply line Vdd and a source of the amplification transistor 23 is connected to the selection transistor 24.

Though it is not shown in FIG. 4, the amplification transistor 23 described above is configured as a bottom-gate type TFT, for example, on the insulation film SZ1G, in a similar fashion to the reset transistor 22 described above. Further, the amplification transistor 23 is covered by the interlayer insulation film SZ2G described above.

In the green readout circuit portion 202G, when a row selection signal is inputted, the selection transistor 24 outputs an electric signal received from the amplification transistor 23 to the vertical signal line 27.

Specifically, a gate of the selection transistor 24 is connected to an address line 28 to which a selection signal is supplied, as shown in FIG. 5. When a selection signal is supplied, the selection transistor 24 is turned on and outputs an output signal which is amplified by the amplification transistor 23 as described above to the vertical signal line 27.

Though it is not shown in FIG. 4, the selection transistor 24 described above is configured as a bottom-gate type TFT, for example, on the insulation film SZ1G, in a similar fashion to the reset transistor 22 and the amplification transistor 23. Further, the selection transistor 24 is covered by the interlayer insulation film SZ2G described above.

Further, in the embodiment, the green readout circuit portion 202G includes a ground electrode 230G, as shown in FIG. 4.

The ground electrode 230G is provided on an upper surface of the interlayer insulation film SZ2G, is positioned between an upper surface of the TFTs such as the reset transistor 22 and the pixel electrode 211G, and is grounded.

The ground electrode 230G is a transparent electrode which transmits light therethrough. For example, the ground electrode 230G is formed by film-depositing metal oxide such as indium tin oxide (ITO) by a film-forming method such as a sputtering method. Here, the ground electrode 230G is formed to have an opening at a part through which the contact CT electrically-connecting the pixel electrode 211G and the source 224SG penetrates.

Further, the ground electrode 230G is covered by an interlayer insulation film SZ3G. The interlayer insulation film SZ3G is made of a silicon oxide film, for example.

On an upper surface of the interlayer insulation film SZ3G, the green photoelectric conversion portion 201G is provided, as shown in FIG. 4. Namely, the pixel electrode 211G, the organic photoelectric conversion layer for sensing green light 210G, and the common electrode 212G are sequentially layered upward.

Parts of the blue photoelectric conversion portion 201B and the blue readout circuit portion 202B and parts of the red photoelectric conversion portion 201R and the red readout circuit portion 202R are configured in a similar fashion to the parts of the green photoelectric conversion portion 201G and the green readout circuit portion 202G which are described above.

That is, the blue photoelectric conversion portion 201B is formed to receive light in a blue wavelength region more than light in other wavelength regions, produce a signal charge, and transmit light in other wavelength regions other than the blue wavelength region therethrough. The blue readout circuit portion 202B is formed to read out the signal charge produced by the blue photoelectric conversion portion 201B.

The green photoelectric conversion portion 201G described above is formed to receive light in a green wavelength region more than light in other wavelength regions in light incident through the blue photoelectric conversion portion 201B and the blue readout circuit portion 202B and transmit light in other wavelength regions therethrough. The green readout circuit portion 202G is formed to read out the signal charge produced by the green photoelectric conversion portion 201G as described above.

The red photoelectric conversion portion 201R is formed to receive light in a red wavelength region more than light in other wavelength regions in light incident through the green photoelectric conversion portion 201G and the green readout circuit portion 202G and transmit light in other wavelength regions therethrough. The red readout circuit portion 202R is formed to read out the signal charge produced by the red photoelectric conversion portion 201R as described above.

Thus, in the embodiment, the photoelectric conversion portion disposed at an upper side of the surface of the substrate 101 among the plurality of photoelectric conversion portions 201R, 201G, and 201B receives light in a lower wavelength region than the photoelectric conversion portion which is disposed at a lower side, and photoelectrically converts the light.

(A-4) Method for Manufacturing Solid-State Imaging Device

A chief part of a method for manufacturing the solid-state imaging device 1 which is described above is now described.

Here, a process for manufacturing the green photoelectric conversion portion 201G and the green readout circuit portion 202G is described.

FIGS. 6A and 6B illustrate a method for manufacturing the green photoelectric conversion portion 201G and the green readout circuit portion 202G according to the embodiment of the present invention.

The reset transistor 22 is first formed as shown in FIG. 6A.

Here, the reset transistor 22 is formed on the insulation film SZ1G as a transparent TFT, for which the structure is the so-called bottom-gate type and the channel region is a light transmissive semiconductor layer.

Though they are not shown in FIGS. 6A and 6B, the amplification transistor 23 and the selection transistor 24 are formed in a similar fashion to the reset transistor 22.

Then, the ground electrode 230G is formed as shown in FIG. 6B.

Here, after the interlayer insulation film SZ2G is formed to cover the reset transistor 22 described above and the like, the ground electrode 230G is formed on the upper surface of the interlayer insulation film SZ2G.

The ground electrode 230G is formed to have the opening through which the contact CT electrically-connecting the pixel electrode 211G and the source 224SG penetrates as shown in FIG. 4.

Next, the green photoelectric conversion portion 201G is formed as shown in FIG. 4.

Here, after the interlayer insulation film SZ3G is formed to cover the ground electrode 230G described above, the contact CT is formed to penetrate through each of the interlayer insulation films SZ3G and SZ2G.

Subsequently, respective elements constituting the green photoelectric conversion portion 201G are provided on the upper surface of the interlayer insulation film SZ3G. Namely, the pixel electrode 211G, the organic photoelectric conversion layer for sensing green light 210G, and the common electrode 212G are sequentially layered.

(A-5) Operation of Solid-State Imaging Device

An operation of the solid-state imaging device 1 which is described above is now described.

In the solid-state imaging device 1 of the "stacked photoelectric conversion layer type" described above, when incident light is incident on each of the pixels P, a signal charge is sequentially produced in each of the photoelectric conversion portions 201R, 201G, and 201B (refer to FIG. 1).

The blue photoelectric conversion portion 201B produces a signal charge corresponding to an amount of light of a blue component included in the incident light. The green photoelectric conversion portion 201G produces a signal charge corresponding to an amount of light of a green component included in the incident light. The red photoelectric conversion portion 201R produces a signal charge corresponding to an amount of light of a red component included in the incident light.

In each of the photoelectric conversion portions 201R, 201G, and 201B, a voltage is applied between the pixel electrode (211G, for example) and the common electrode (212G, for example), and a signal charge is read out from each of the organic photoelectric conversion layers (210R, for example) to each of the readout circuit portions (202R, for example).

A detailed operation of reading out a signal charge which is produced in the green photoelectric conversion portion 201G is described (refer to FIG. 4).

In the green photoelectric conversion portion 201G, a voltage is applied to the organic photoelectric conversion layer for sensing green light 210G by the pixel electrode 211G and the common electrode 212G. Then, a signal charge produced in the organic photoelectric conversion layer for sensing green light 210G is read out by the green readout circuit portion 202G through the contact CT.

As described above, the voltage applied to the organic photoelectric conversion layer for sensing green light 210G may produce such a state which is equal to the state that a voltage is applied to a gate of the TFT such as the reset transistor 22, causing a defect such as deterioration of image quality of a picked-up image.

However, in the embodiment, the ground electrode 230G which is grounded is provided between the organic photoelectric conversion layer for sensing green light 210G and the TFT such as the reset transistor 22.

Therefore, the ground electrode 230G can prevent an occurrence of such state that unnecessary voltage other than a gate voltage is applied to a channel forming region of the TFT, in the embodiment.

A similar operation to the operation of the green photoelectric conversion portion 201G and the green readout circuit portion 202G described above is executed in the red photoelectric conversion portion 201R and the red readout circuit portion 202R, and the blue photoelectric conversion portion 201B and the blue readout circuit portion 202B. Accordingly, a similar advantageous effect can be offered.

(D) Overview

As described above, in the embodiment, the green photoelectric conversion portion 201G includes the organic photoelectric conversion layer for sensing green light 210G which receives incident light and produces a signal charge, and the pixel electrode 211G and the common electrode 212G which sandwich the organic photoelectric conversion layer for sensing green light 210G. In the green photoelectric conversion portion 201G, the pixel electrode 211G, the organic photoelectric conversion layer for sensing green light 210G, and the common electrode 212G are sequentially layered upward on the imaging surface (refer to FIG. 4).

The green readout circuit portion 202G includes the readout circuit 20 which is electrically connected with the pixel electrode 211G so as to read out the signal charge produced in the green photoelectric conversion portion 201G (refer to FIGS. 4 and 5). In addition, the green readout circuit portion 202G includes the ground electrode 230G that is grounded and interposed between the readout circuit 20 (the reset transistor 22, for example) and the pixel electrode 211G on the imaging surface (refer to FIG. 4).

Therefore, in the embodiment, the ground electrode (230G, for example) can prevent an occurrence of the state that unnecessary voltage other than a gate voltage is applied to the channel forming region of the TFT constituting each of the readout circuit portions 202R, 202G, and 202B, as described above.

Accordingly, the solid-state imaging device 1 according to the embodiment can suppress an influence of an external voltage on the readout circuit, so that an interlayer insulation film is not demanded to be formed thick. Consequently, color deviation can be suppressed and a stable operation can be realized.

In addition, in the embodiment, the readout circuit 20 (the reset transistor 22, for example) is formed to transmit light therethrough.

Therefore, an amount of light incident on each of the photoelectric conversion portions 201R, 201G, and 201B can be increased in the embodiment. Further, a degree of freedom of the layout of the readout circuit 20 can be improved.

Accordingly, advantageous effects such as improvement of image quality of a picked-up image can be offered in the embodiment.

<2. Modification>

The practice of the present invention is not limited to the above-described embodiment, but various modifications can be employed.

For example, in FIG. 4, the interlayer insulation film SZ3G (dielectric film) interposed between the pixel electrode 211G and the ground electrode 230G may be thinned so as to function as a capacitor.

It is preferable that the film thickness of the interlayer insulation film SZ3G (dielectric film) be about 50 nm to about 200 nm, for example. Accordingly, the capacitor can accumulate signal charges produced in the photoelectric conversion film.

Further, the semiconductor element constituting the readout circuit 20 is the TFT of the bottom-gate structure in the above embodiment, but the semiconductor element is not limited to this. For example, a TFT of a top-gate structure can also offer similar advantageous effects.

Furthermore, a case where the readout circuit 20 is composed of a transparent TFT is described in the above-described embodiment, but the embodiment of the present invention is not limited to this. The embodiment of the present invention can be applied in the case where a TFT is made of a material such as semiconductor which does not transmit light therethrough.

Figure 7A:
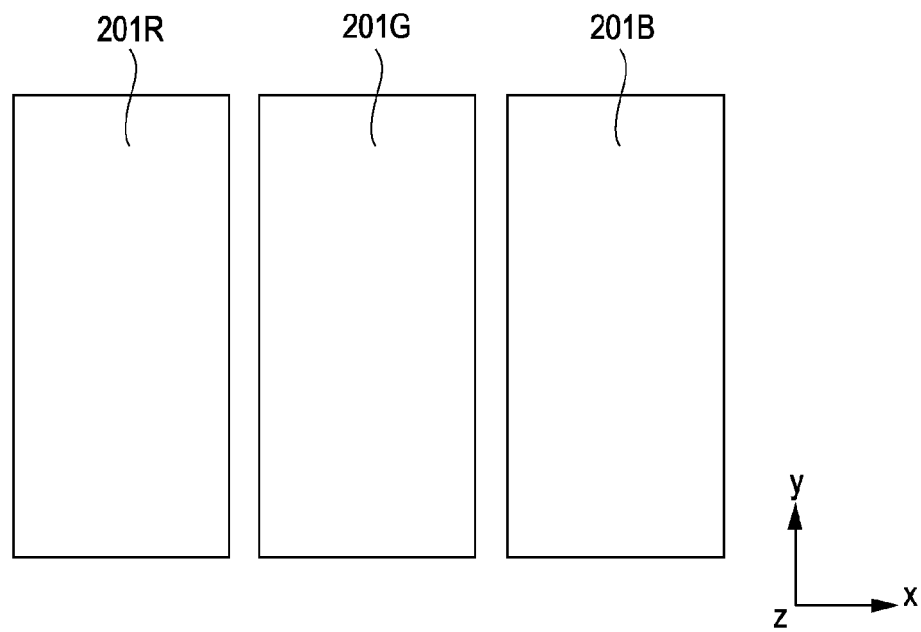
FIGS. 7A and 7B schematically illustrate a modification of the embodiment of the present invention.
Figure 7B:
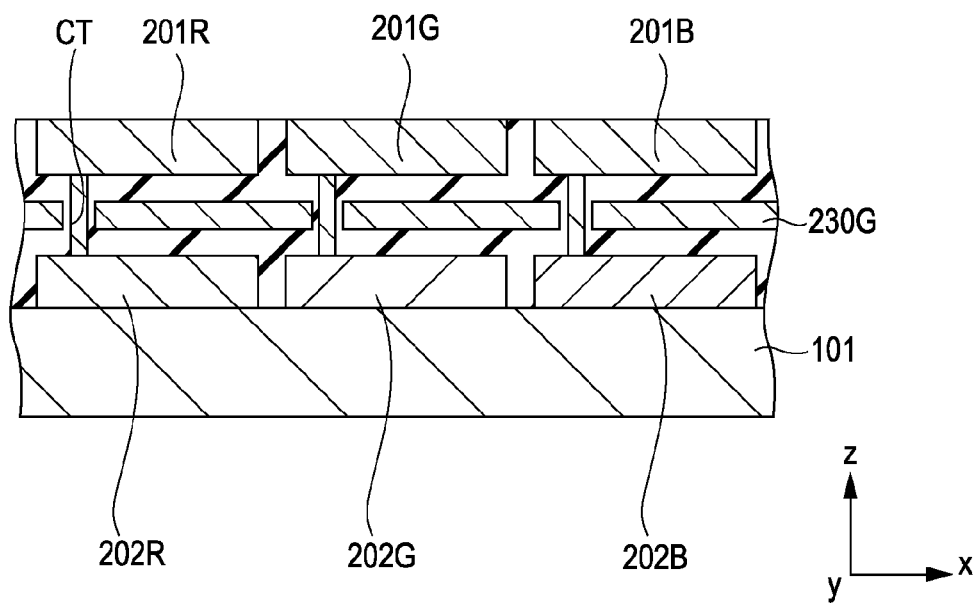
Figure 9:
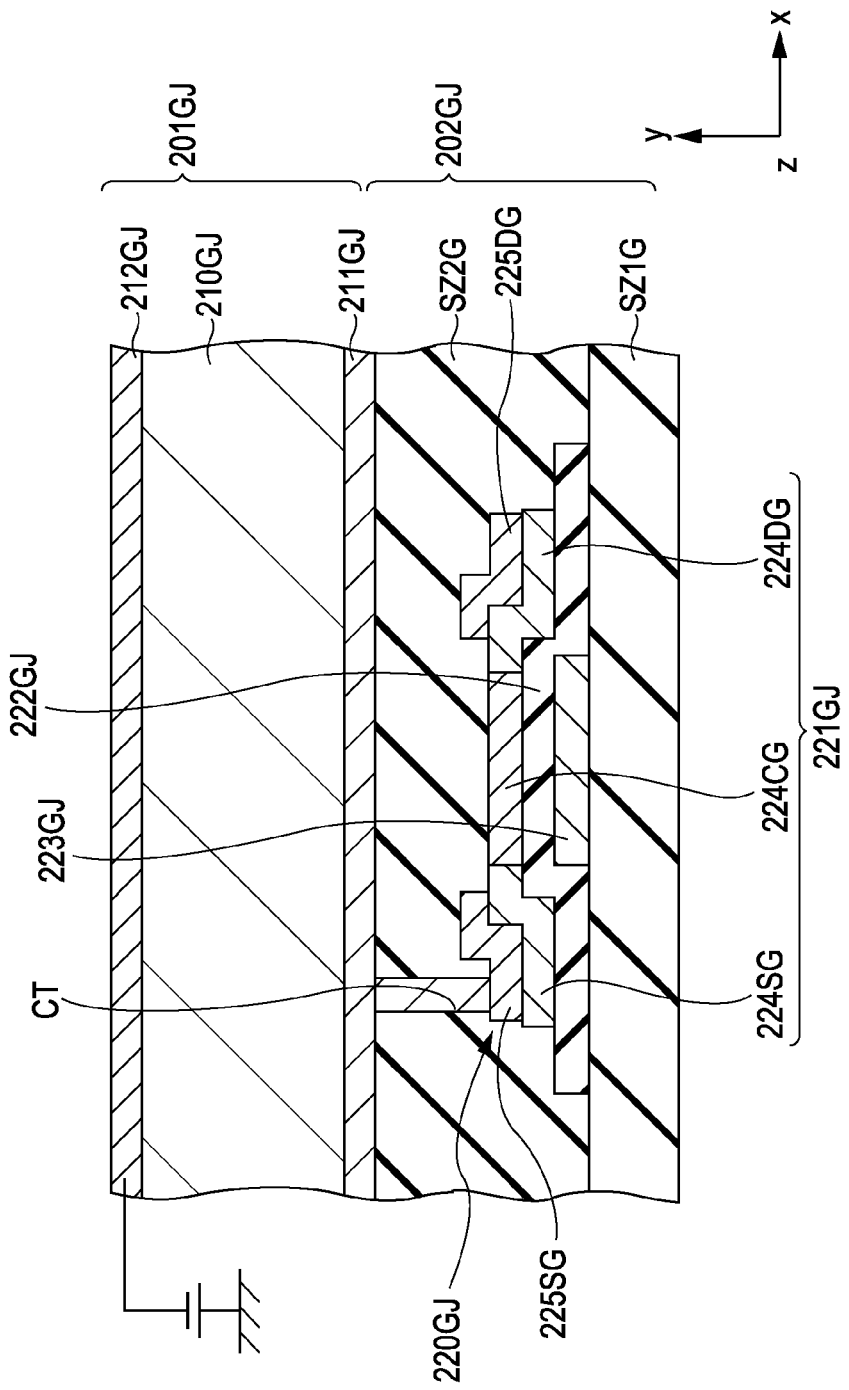
FIG. 9 schematically illustrates the CMOS type image sensor of the "stacked photoelectric conversion layer type".

FIGS. 7A and 7B schematically illustrate a modification of the embodiment of the present invention. FIG. 7A is a top view and FIG. 7B is a sectional view. FIGS. 7A and 7B schematically show each element, but the detailed configuration is similar to that of the above-described embodiment.

In the above-described case, the three kinds of photoelectric conversion portions 201R, 201G, and 201B which receive light of respective three primary colors may be arranged on the imaging surface (xy surface) of the substrate 101 as shown in FIGS. 7A and 7B. Then, the readout circuit portions 202R, 202G, and 202B may be provided respectively below the photoelectric conversion portions 201R, 201G, and 201B.

Further, the above-described embodiment of the present invention is applied to the camera, but the embodiment is not limited to this. The embodiment of the present invention may be applied to an electronic device including a solid-state imaging device, such as a scanner and a photocopier.

Here, the solid-state imaging device 1 of the above-described embodiment corresponds to a solid-state imaging device of the present invention. The readout circuit 20 of the above-described embodiment corresponds to a readout circuit of the present invention. The camera 40 of the above-described embodiment corresponds to an electronic device of the present invention. The substrate 101 of the above-described embodiment corresponds to a substrate of the present invention. The blue photoelectric conversion portion 201B of the above-described embodiment corresponds to a photoelectric conversion portion and a first photoelectric conversion portion of the present invention. The green photoelectric conversion portion 201G of the above-described embodiment corresponds to a photoelectric conversion portion and a second photoelectric conversion portion of the present invention. The red photoelectric conversion portion 201R of the above-described embodiment corresponds to a photoelectric conversion portion and a third photoelectric conversion portion of the present invention. The blue readout circuit portion 202B of the above-described embodiment corresponds to a readout circuit portion and a first readout circuit portion of the present invention. The green readout circuit portion 202G of the above-described embodiment corresponds to a readout circuit portion and a second readout circuit portion of the present invention. The red readout circuit portion 202R of the above-described embodiment corresponds to a readout circuit portion and a third readout circuit portion of the present invention. The organic photoelectric conversion layer for sensing green light 210G of the above-described embodiment corresponds to a photoelectric conversion film of the present invention. The pixel electrode 211G of the above-described embodiment corresponds to a first electrode of the present invention. The common electrode 212G of the above-described embodiment corresponds to a second electrode of the present invention. The ground electrode 230G of the above-described embodiment corresponds to a ground electrode of the present invention. The imaging surface PS of the above-described embodiment corresponds to an imaging surface of the present invention. The interlayer insulation film SZ3G of the above-described embodiment corresponds to a dielectric film of the present invention.

The present application contains subject matter related to that disclosed in Japanese Priority Patent Application JP 2009-261994 filed in the Japan Patent Office respectively on Nov. 17, 2009 and Japanese Priority Patent Application JP 2010-202141 filed in the Japan Patent Office respectively on Sep. 9, 2010, the entire content of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state imaging device, comprising:
a plurality of photoelectric conversion portions layered above an imaging surface of a substrate, and
a plurality of readout circuit portions layered above the imaging surface of the substrate, each readout circuit corresponding to one of the plurality of photoelectric conversion portions and located below the corresponding photoelectric conversion portion;
wherein,
each photoelectric conversion portion includes a photoelectric conversion film that receives incident light and produces a signal charge, for each photoelectric conversion portion, the photoelectric conversion film is in-between a first electrode and a second electrode, for each photoelectric conversion portion, the first electrode, the photoelectric conversion film, and the second electrode are sequentially layered upward on the imaging surface, each readout circuit portion includes a readout circuit that is electrically connected with the first electrode of its respective photoelectric conversion portion and reads out the signal charge produced by the photoelectric conversion portion, and a ground electrode that is grounded, and for each readout circuit portion, the ground electrode is in-between the readout circuit and the first electrode on the imaging surface.

2. The solid-state imaging device according to claim 1, wherein the readout circuit is formed to transmit light therethrough.

3. The solid-state imaging device according to claim 2, further comprising:

for each photoelectric conversion portion, a dielectric film in-between the first electrode; and the ground electrode; wherein, a capacitor, which comprises the first electrode, the ground electrode, and the dielectric film, is configured to accumulate the signal charge produced by the photoelectric conversion film.

4. The solid-state imaging device according to claim 3, wherein:

the plurality of photoelectric conversion portions include (a) a first photoelectric conversion portion that receives light in a first wavelength region and produces a signal charge, (b) a second photoelectric conversion portion that receives incident light through the first photoelectric conversion portion in a second wavelength region, the second wavelength region being different from the first wavelength region and produces a signal charge, and (c) a third photoelectric conversion portion that receives incident light through the second photoelectric conversion portion in a third wavelength region, the third wavelength region being different from the first and second wavelength regions and produces a signal charge, and the plurality of readout circuit portions include (a) a first readout circuit portion that reads out the signal charge produced by the first photoelectric conversion portion, (b) a second readout circuit portion that reads out the signal charge produced by the second photoelectric conversion portion, and (c) a third readout circuit portion that reads out the signal charge produced by the third photoelectric conversion portion.

5. The solid-state imaging device according to claim 4, wherein the first photoelectric conversion portion receives light in a blue wavelength region, the second photoelectric conversion portion receives light in a green wavelength region, and the third photoelectric conversion portion receives light in a red wavelength region.

6. A method for manufacturing a solid-state imaging device comprising the steps of:

providing a plurality of photoelectric conversion portions in layers above an imaging surface of a substrate; and providing a plurality of readout circuit portions in layers above the imaging surface of the substrate, each readout circuit corresponding to one of the plurality of photoelectric conversion portions and located below the corresponding photoelectric conversion portion, wherein, each photoelectric conversion portion comprises a first electrode, a photoelectric conversion film configured to receive incident light and produce a signal charge, and a second electrode, for each photoelectric conversion portion, the photoelectric conversion film is in-between the first electrode and the second electrode, and each readout circuit portion includes a ground electrode that is grounded, the ground electrode is interposed between a readout circuit that is electrically connected with the first electrode of its respective photoelectric conversion portion and reads out the signal charge produced by the photoelectric conversion portion and the first electrode.

7. An electronic device, comprising:

a solid-state imaging device that includes a plurality of photoelectric conversion portions layered above an imaging surface of a substrate; and a plurality of readout circuit portions layered above the imaging surface of the substrate, each read out circuit portion corresponding to one of the plurality of photoelectric conversion portions and located below the corresponding photoelectric conversion portion, wherein, each photoelectric conversion portion comprises (a) a first electrode, (b) a second electrode and (c) a photoelectric conversion film that is in-between the first and second electrodes, the photoelectric conversion film configured to receive incident light and produce a signal charge, for each photo electric conversion portion, the first electrode, the photoelectric conversion film, and the second electrode are sequentially layered upward on the imaging surface, each readout circuit portion includes a readout circuit that is electrically connected with the first electrode of its respective photoelectric conversion portion and reads out the signal charge produced by the photoelectric conversion portion, and a ground electrode that is grounded, and for each readout circuit portion, the ground electrode is inbetween the readout circuit and the first electrode on the imaging surface.

\* \* \* \* \*